United States Patent
Arora et al.

(10) Patent No.: US 9,530,718 B2
(45) Date of Patent: Dec. 27, 2016

(54) DBF FILM AS A THERMAL INTERFACE MATERIAL

(71) Applicants: Hitesh Arora, Chandler, AZ (US); Mihir A. Oka, Chandler, AZ (US); Chandra M. Jha, Chandler, AZ (US)

(72) Inventors: Hitesh Arora, Chandler, AZ (US); Mihir A. Oka, Chandler, AZ (US); Chandra M. Jha, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 801 days.

(21) Appl. No.: 13/727,409

(22) Filed: Dec. 26, 2012

(65) Prior Publication Data

US 2014/0177194 A1 Jun. 26, 2014

(51) Int. Cl.
*H01L 23/373* (2006.01)
*H01L 23/31* (2006.01)
*H01L 23/00* (2006.01)

(52) U.S. Cl.
CPC ........ *H01L 23/3737* (2013.01); *H01L 23/3142* (2013.01); *H01L 23/3157* (2013.01); *H01L 23/562* (2013.01); *H01L 2224/16225* (2013.01); *H01L 2924/15311* (2013.01)

(58) Field of Classification Search
CPC .............................. C08L 63/00; H01L 23/3737
USPC .......................................................... 361/767
See application file for complete search history.

(56) References Cited

U.S. PATENT DOCUMENTS

| | | | |
|---|---|---|---|
| 8,287,996 B2 | 10/2012 | Xu et al. | |
| 8,319,318 B2 | 11/2012 | Nalla et al. | |
| 2009/0053498 A1* | 2/2009 | Matsuura et al. | 428/220 |
| 2009/0135569 A1* | 5/2009 | Williams | H01L 21/56 361/772 |
| 2010/0314781 A1* | 12/2010 | Hayashi | H01L 21/6836 257/778 |
| 2011/0151624 A1* | 6/2011 | Xu et al. | 438/114 |
| 2011/0156280 A1* | 6/2011 | Takamoto | H01L 21/6836 257/778 |
| 2011/0159284 A1* | 6/2011 | Choi et al. | 428/355 EP |
| 2011/0241186 A1* | 10/2011 | Nalla et al. | 257/659 |
| 2011/0256666 A1* | 10/2011 | Sugo et al. | 438/113 |
| 2011/0256669 A1* | 10/2011 | Takamoto | H01L 21/6836 438/118 |
| 2012/0235282 A1* | 9/2012 | Tomono | H01L 21/6836 257/618 |

* cited by examiner

*Primary Examiner* — Megan McCulley
(74) *Attorney, Agent, or Firm* — Blakely, Sokoloff, Taylor & Zafman LLP

(57) ABSTRACT

A die backside film including a matrix material; and an amount of filler particles to render the die backside film thermally conductive, wherein a thermal conductivity of the amount of filler particles is greater than a thermal conductivity of silica particles. A method including introducing a die backside film on a backside surface of a die, the die backside film including a matrix material including an elastomer an amount of filler particles to render the die backside film thermally conductive, wherein a thermal conductivity of the amount of filler particles is greater than a thermal conductivity of silica particles; and disposing the die in a package.

11 Claims, 2 Drawing Sheets

DBF FILM AS A THERMAL INTERFACE MATERIAL

FIELD

Integrated circuit packaging

BACKGROUND

A die backside film (DBF) is a material that is applied to a backside (non-device side) of an integrated circuit die in packaging technologies, including packaging technologies related to mobile phones and tablet platforms. These films provide many functionalities such as die crack protection as well as a laser markable surface for unit level identification. A typical DBF includes a matrix material of, for example, including an epoxy resin, a dye and a filler material of silica.

Current DBF materials have relatively low thermal conductivity such as on the order of 0.5 watts per meter per Kelvin (W/mK). The relatively low thermal conductivity limits application of DBF materials to low power packages. Testing such packages also requires that a package be combined with a more thermally conductive material (e.g., a thermally conductive material greater than 3 W/mK) during testing. In other words, a removable thermal interface material (TIM) must be added to the die prior to reliability testing.

DETAILED DESCRIPTION

Figure 1:
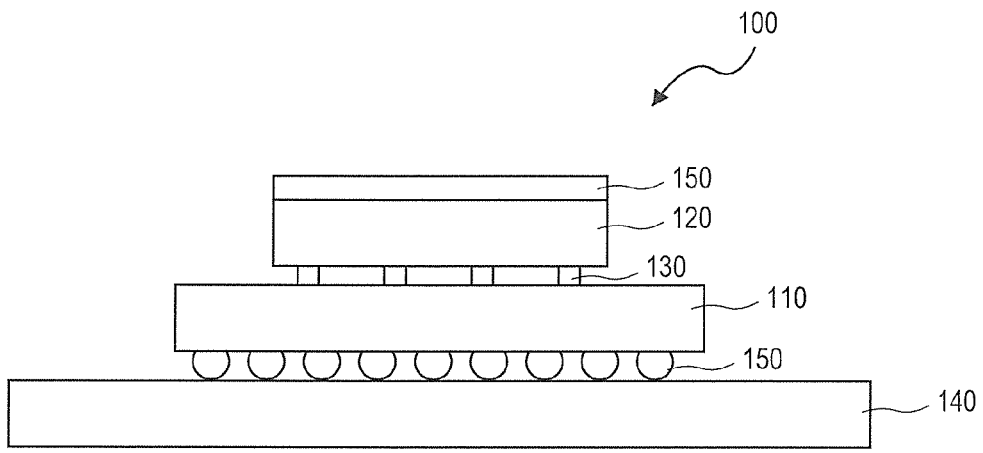
FIG. 1 shows a schematic side view of an integrated circuit die connected to a package and the package connected to a printed circuit board.

FIG. 1 shows a schematic side view and integrated circuit die connected to a package. In one embodiment, package 110 is a flip-chip ball grid array package. In a flip-chip ball grid array package, die 120 is mounted with a device side towards package 110 (device side down as viewed) and connects to package 110 via solder interconnections 130. In another embodiment, package 110 is a bumpless build-up layer technology package in which die 120 is mounted to package 110 without solder interconnections (interconnections 130). In the embodiment shown in FIG. 1, package 110 is connected to contact points of printed circuit board 140 through, for example, solder interconnections.

Overlying a backside surface of die 120 in FIG. 1 is a die backside film material. In one embodiment, die backside film material includes a matrix of epoxy/polyimide/acrylic resin and elastomer (acrylic/high impact polystyrene/polybutadiene rubber) and a thermally conductive filler material. In one embodiment, the thermally conductive filler material consists of particles. Representatively, the particles include silica, zinc oxide, alumina, aluminum, copper, silver, graphite, or combinations of these materials. Table 1 shows the thermal conductivity of various filler particles. In one embodiment, the thermal conductivity of die backside film material 150 is greater than a thermal conductivity of silica (about 1 W/mK). Thus, where silica is used as a filler particle, silica is combined with another filler particle or particles with a higher thermal conductivity to provide a film with particles having an average thermal conductivity greater than a thermal conductivity of silica. Representatively, a suitable thermal conductivity range for a DBF material is 3 W/mK or greater.

TABLE 1

| Filler Particles | Thermal conductivity (W/mK) |
|---|---|
| Silica | 1 |
| Zinc oxide | 21 |
| Alumina | 30 |
| Aluminum | 250 |
| Copper | 400 |
| Silver | 429 |
| Graphite | 2000 |

The filler particles, in one embodiment, have a particle size on the order of five microns or less.

As noted above, a die backside film material such as material 150 includes a matrix of a base resin and an elastomer. Suitable base resins include epoxy resins and the DBF material may also include a hardener such as a phenolic resin. Also included in the matrix material is a dye to allow laser marking. Any dye/pigment which has absorbance maximum in the visible wavelength range is suitable.

In one embodiment, an amount of an elastomer is selected based on the desired post-cure elastic modulus of the material or an amount to tune the modulus of the film. Generally, a higher modulus (e.g., on the order of 3 gigaPascals (GPa) or greater) is desired for laser marking, die crack protection and warpage control. On the other hand, a lower modulus is desired for lower interfacial thermal resistance (e.g., less than 0.05° C.cm$^2$/W). In one embodiment, an amount of elastomer is selected to provide a post-cure modulus range of the DBF film of 1 GPa to 3 GPa.

A representative formulation of a DBF material is an epoxy resin of 15-25 weight percent; phenolic resin of 15-25 weight percent; acrylic elastomer of 10-30 weight percent; dye of 1-10 weight percent; and a thermally conductive filler or fillers of 30-80 weight percent.

In another embodiment, a DBF material includes an adhesion promoter present in a representative amount in the range of 300 to 600 parts per million or less than 1 weight percent of the DBF composition. In one embodiment, the adhesion promoter improves adhesion of the DBF material with a silicon die and thus, lowers the interfacial contact resistance. In one embodiment, the adhesion promoter is selected from a compound represented by the following formula:

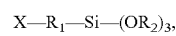

$$X-R_1-Si-(OR_2)_3,$$

wherein X is selected from the group consisting of an aryl moiety, an amine moiety and a thiol moiety. Suitable aryl moieties include a substituted or an unsubstituted phenyl group. Suitable amines include unsubstituted amines, primary amines and secondary amines. X is selected, in one embodiment, for its affinity to the filler particles of the DBF material or another component of the matrix. For example, a phenyl moiety has available electrons that have affinity for a graphite filler material.

In the above formula, $R_1$ is a C1-C6 saturated chain and $R_2$ is a C1-C2 alkyl representing an alkoxy group that has affinity for silicon or covalent bonding to a die surface.

Figure 2:
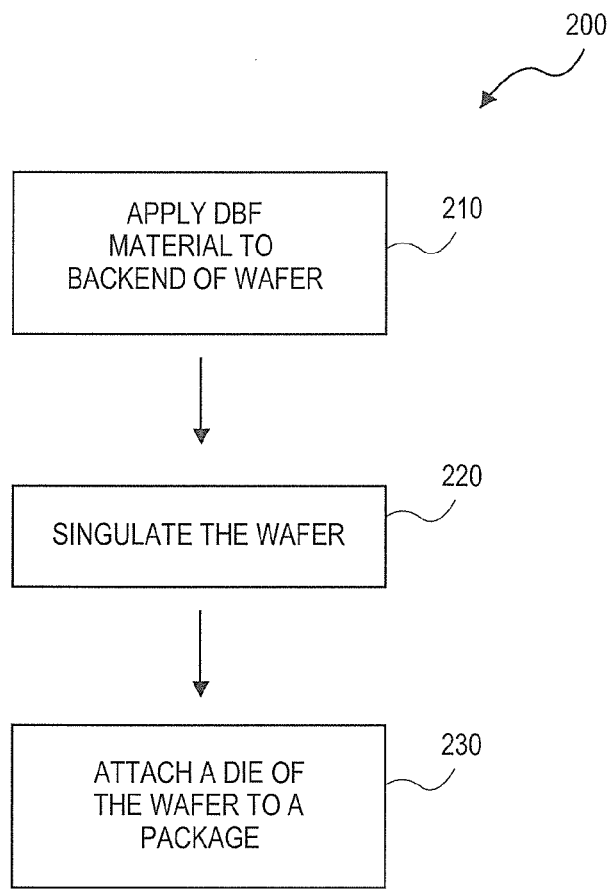
FIG. 2 shows a flow chart of a process of applying a DBF material to a wafer, singulating and attaching a die to a package.

In one embodiment, a DBF material such as DBF material 150 may be applied to a backside of a die at the wafer level (i.e., prior to singulating a wafer in the individual die). As illustrated in FIG. 2 and the process of FIG. 2, referring to block 210, the individual components of a DBF material are combined. In one embodiment, the components are combined with a solvent to form a solvent contacting mixture. Once the DBF material containing mixture is constituted, the DBF material is applied to a backside of a wafer. One representative method for applying DBF material is through a spin coating technique. In one embodiment, the DBF material is applied to a thickness on the order of 10 microns or less. Following its application, the DBF material is allowed to cure possibly by exposing the film to thermal radiation.

Referring to block 220, once DBF material is applied to a backside of a wafer and allowed to cure, the wafer may be singulated into individual dice. Following singulation, a die from the wafer may be attached to a package as desired. Such package may then undergo reliability testing such as a stress test that will be done with temperature cycling accelerated temperature/humidity (HAST) testing and bake tests. Because the thermal conductivity of the DBF material on a die is increased, the testing of an individual die or die in package may proceed without an additional TIM added. Representatively, prior art packaging requires a thermal interface material on a die that had a thermal conductivity greater than 3 W/mK. In addition, a DBF material with a thermal conductivity property (e.g., a thermal conductivity greater than 3 W/mK) offers heat transfer capabilities allowing DBF material to be used on higher power dice.

Figure 3:
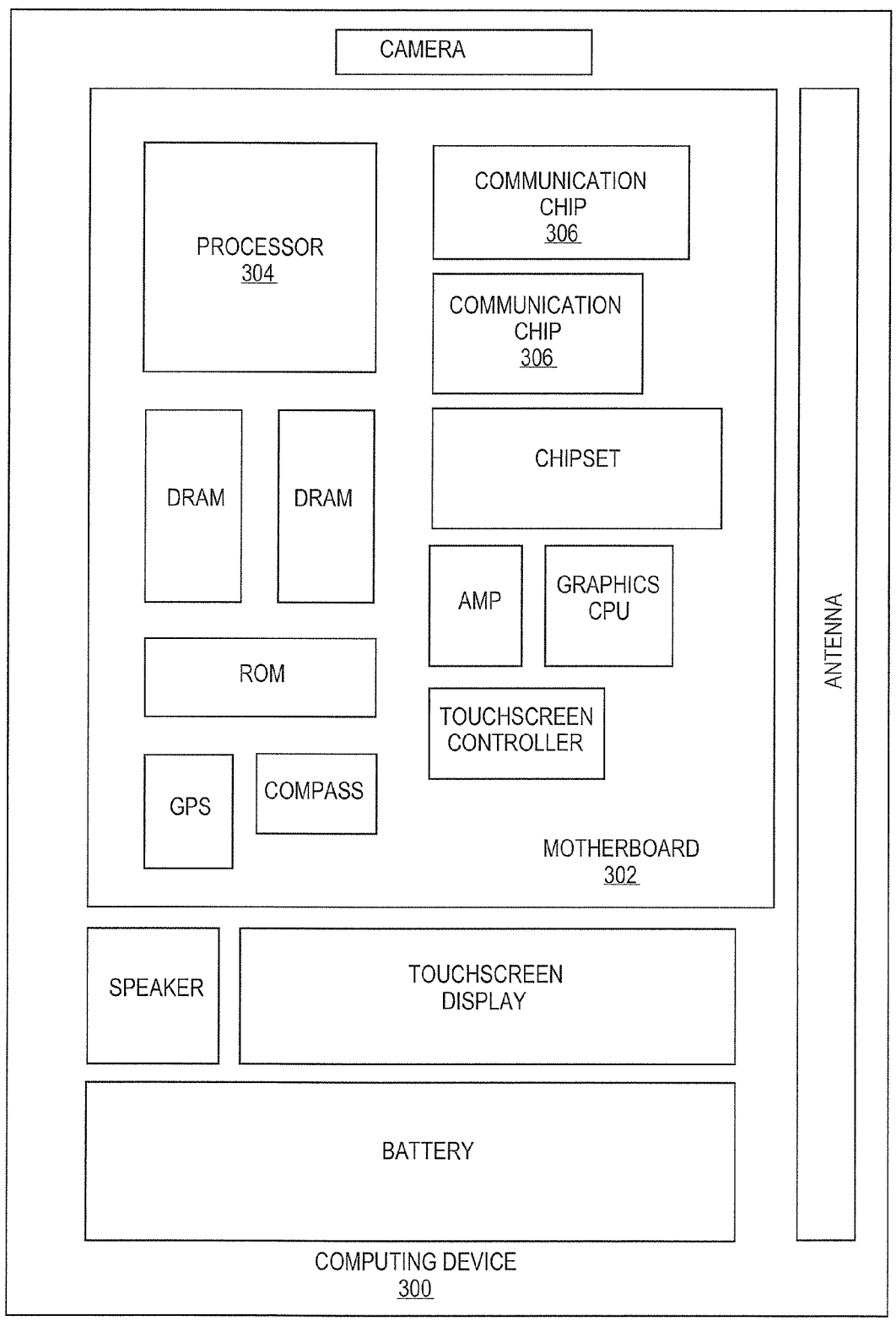
FIG. 3 illustrates a computing device in accordance with one implementation.

FIG. 3 illustrates a computing device 300 in accordance with one implementation. Computing device 300 houses board 302. Board 302 may include a number of components, including but not limited to processor 304 and at least one communication chip 306. Processor 304 is physically and electrically coupled to board 302. In some implementations the at least one communication chip 306 is also physically and electrically coupled to board 302. In further implementations, communication chip 306 is part of processor 304.

Depending on its applications, computing device 300 may include other components that may or may not be physically and electrically coupled to board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 306 enables wireless communications for the transfer of data to and from computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

Processor 304 of computing device 300 includes an integrated circuit die packaged within processor 304. In some implementations, the package formed in accordance with embodiment described above utilizes flip-chip ball grid array technology or BBUL technology with a die and a thermally conductive DBF film such as described above. The term "processor" may refer to any device or portion of a device that processes electronic data from registers and/or memory to transform that electronic data into other electronic data that may be stored in registers and/or memory.

Communication chip 306 also includes an integrated circuit die packaged within communication chip 306. In accordance with another implementation, package is based on BBUL technology and incorporates a primary core surrounding a TSV or non-TSV integrated circuit die that inhibits package warpage. Such packaging will enable stacking of various devices, including but not limited to, a microprocessor chip (die) with a memory die with a graphics die with a chip set with GPS.

In further implementations, another component housed within computing device 300 may contain a microelectronic package that incorporates a primary BBUL carrier implementation such as described above.

In various implementations, computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 300 may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A die backside film comprising:
a matrix material;
an amount of filler particles to render the die backside film thermally conductive, wherein a thermal conductivity of the amount of filler particles is greater than a thermal conductivity of silica particles; and
an adhesion promoter having a property operable to improve an adhesion of the die backside film to a die, wherein the film comprises a post-cure elastic modulus range of 1 gigaPascal to 3 gigaPascals.

2. The die backside film of claim 1, wherein the amount of filler particles comprise particles of at least one of silica, zinc oxide, alumina, aluminum, copper, silver and graphite, with the proviso that if an amount of filler particles comprises silica, a second amount of particles of zinc oxide, alumina, aluminum, copper, silver and graphite is also present.

3. The die backside film of claim 1, wherein the matrix material comprises an epoxy resin and an elastomer.

4. The die backside film of claim 1, wherein the adhesion promoter is represented by the following formula:

X—R1-Si—(OR$_2$)$_3$ wherein X is selected from the group consisting of an aryl moiety, an amine moiety and a thiol moiety;
R$_1$ is a C1-C6 saturated or unsaturated chain; and
R$_2$ is a C1-C2 alkyl,
wherein X is selected for its affinity to the filler particles.

5. A method comprising:
introducing a die backside film on a backside surface of a die, the die backside film comprising a matrix material comprising an elastomer, an amount of filler particles to render the die backside film thermally conductive and an adhesion promoter having a property operable to improve an adhesion of the die backside film to the die, wherein a thermal conductivity of the amount of filler particles is greater than a thermal conductivity of silica particles; and
disposing the die in a package,
wherein the film comprises a post-cure elastic modulus range of 1 gigaPascal to 3 gigaPascals.

6. The method of claim 5, wherein the amount of filler particles comprise particles of at least one of silica, zinc oxide, alumina, aluminum, copper, silver and graphite, with the proviso that if an amount of filler particles comprises silica, a second amount of particles of zinc oxide, alumina, aluminum, copper, silver and graphite is also present.

7. The method of claim 5, wherein the matrix material comprises an epoxy resin.

8. The method of claim 5, wherein the adhesion promoter is represented by the following formula:

X—R1-Si—(OR$_2$)$_3$ wherein X is selected from the group consisting of an aryl moiety, an amine moiety and a thiol moiety;
R$_1$ is a C1-C6 saturated or unsaturated chain; and
R$_2$ is a C1-C2 alkyl,
wherein X is selected for its affinity to the filler particles.

9. An apparatus comprising:
a package comprising a microprocessor disposed in a carrier, the microprocessor comprising a first side and an opposite second side comprising a device side, the carrier comprising a plurality of conductive posts;
a die backside film on the first side of the microprocessor, comprising a matrix material comprising an elastomer, an amount of filler particles to render the die backside film thermally conductive and an adhesion promoter having a property operable to improve an adhesion of the die backside film to the microprocessor, wherein a thermal conductivity of the amount of filler particles is greater than a thermal conductivity of silica particles and wherein the film comprises a post-cure elastic modulus range of 1 gigaPascal to 3 gigaPascals; and
a printed circuit board coupled to at least a portion of the plurality of conductive posts of the carrier.

10. The apparatus of claim 9, wherein the amount of filler particles of the die backside film comprise particles of at least one of silica, zinc oxide, alumina, aluminum, copper, silver and graphite, with the proviso that if an amount of filler particles comprises silica, a second amount of particles of zinc oxide, alumina, aluminum, copper, silver and graphite is also present.

11. The apparatus of claim 9, wherein the adhesion promoter is represented by the following formula:

X—R1-Si—(OR$_2$)$_3$ wherein X is selected from the group consisting of an aryl moiety, an amine moiety and a thiol moiety;
R$_1$ is a C1-C6 saturated or unsaturated chain; and
R$_2$ is a C1-C2 alkyl,
wherein X is selected for its affinity to the filler particles.

* * * * *